(12) United States Patent
Jeng et al.

(10) Patent No.: US 9,570,366 B2
(45) Date of Patent: Feb. 14, 2017

(54) PASSIVATION LAYER FOR PACKAGED CHIP

(71) Applicant: TAIWAN SEMICONDUCTOR MANUFACTURING COMPANY, LTD., Hsinchu (TW)

(72) Inventors: Shin-Puu Jeng, Hsinchu (TW); Wei-Cheng Wu, Hsinchu (TW); Shang-Yun Hou, Jubei (TW); Chen-Hua Yu, Hsinchu (TW); Tzuan-Horng Liu, Longtan Township (TW); Tzu-Wei Chiu, Hsinchu (TW); Kuo-Ching Hsu, Chung-Ho (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 2 days.

(21) Appl. No.: 14/028,673

(22) Filed: Sep. 17, 2013

(65) Prior Publication Data

US 2014/0014959 A1    Jan. 16, 2014

Related U.S. Application Data

(63) Continuation of application No. 13/313,747, filed on Dec. 7, 2011, now Pat. No. 8,558,229.

(51) Int. Cl.
*H01L 23/48* (2006.01)
*H01L 21/66* (2006.01)
(Continued)

(52) U.S. Cl.
CPC ......... *H01L 22/34* (2013.01); *H01L 21/76885* (2013.01); *H01L 22/32* (2013.01); *H01L 23/49838* (2013.01); *H01L 24/11* (2013.01); *H01L 24/13* (2013.01); *G01R 31/2884* (2013.01); *H01L 24/16* (2013.01); *H01L 2224/02126* (2013.01); *H01L 2224/0401* (2013.01); *H01L 2224/05001* (2013.01);
(Continued)

(58) Field of Classification Search
CPC .... H01L 24/11; H01L 24/13; H01L 21/76885; H01L 22/34; H01L 22/32; H01L 23/49838
USPC .............. 257/48, E23.021, 737; 438/15, 127
See application file for complete search history.

(56) References Cited

U.S. PATENT DOCUMENTS

| | | |
|---|---|---|
| 4,811,082 A | 3/1989 | Jacobs et al. |
| 4,990,462 A | 2/1991 | Sliwa, Jr. |

(Continued)

FOREIGN PATENT DOCUMENTS

| | | |
|---|---|---|
| TW | 200416918 | 9/2004 |
| TW | 200629438 | 8/2006 |

(Continued)

*Primary Examiner* — Trung Q Dang
(74) *Attorney, Agent, or Firm* — Haynes and Boone, LLP

(57) ABSTRACT

A packaged IC chip includes a testing pad, wherein the testing pad is electrically connected to devices in the packaged integrated circuit chip. The packaged IC chip further includes a first passivation layer over a portion of the testing pad, and a second passivation layer covering a surface of the testing pad and a portion of the first passivation layer surrounding the testing region of the testing pad. A distance between edges of the second passivation layer covering the surface of the testing pad to edges of the testing pad is in a range from about 2 mm to about 15 mm.

20 Claims, 7 Drawing Sheets

(51) Int. Cl.
*H01L 23/00* (2006.01)
*H01L 21/768* (2006.01)
*H01L 23/498* (2006.01)
*G01R 31/28* (2006.01)

(52) U.S. Cl.
CPC ............ *H01L 2224/0554* (2013.01); *H01L 2224/10126* (2013.01); *H01L 2224/13005* (2013.01); *H01L 2224/16225* (2013.01); *H01L 2924/12044* (2013.01); *H01L 2924/15311* (2013.01)

(56) References Cited

U.S. PATENT DOCUMENTS

| | | | |
|---|---|---|---|
| 5,075,253 | A | 12/1991 | Sliwa, Jr. |
| 5,380,681 | A | 1/1995 | Hsu |
| 5,481,133 | A | 1/1996 | Hsu |
| 6,002,177 | A | 12/1999 | Gaynes et al. |
| 6,187,678 | B1 | 2/2001 | Gaynes et al. |
| 6,229,216 | B1 | 5/2001 | Ma et al. |
| 6,236,115 | B1 | 5/2001 | Gaynes et al. |
| 6,271,059 | B1 | 8/2001 | Bertin et al. |
| 6,279,815 | B1 | 8/2001 | Correia et al. |
| 6,355,501 | B1 | 3/2002 | Fung et al. |
| 6,426,556 | B1 * | 7/2002 | Lin .................. H01L 24/03 257/738 |
| 6,434,016 | B2 | 8/2002 | Zeng et al. |
| 6,448,661 | B1 | 9/2002 | Kim et al. |
| 6,461,895 | B1 | 10/2002 | Liang et al. |
| 6,562,653 | B1 | 5/2003 | Ma et al. |
| 6,570,248 | B1 | 5/2003 | Ahn et al. |
| 6,600,222 | B1 | 7/2003 | Levardo |
| 6,607,938 | B2 | 8/2003 | Kwon et al. |
| 6,661,085 | B2 | 12/2003 | Kellar et al. |
| 6,762,076 | B2 | 7/2004 | Kim et al. |
| 6,790,748 | B2 | 9/2004 | Kim et al. |
| 6,887,769 | B2 | 5/2005 | Kellar et al. |
| 6,908,565 | B2 | 6/2005 | Kim et al. |
| 6,908,785 | B2 | 6/2005 | Kim |
| 6,924,551 | B2 | 8/2005 | Rumer et al. |
| 6,943,067 | B2 | 9/2005 | Greenlaw |
| 6,946,384 | B2 | 9/2005 | Kloster et al. |
| 6,975,016 | B2 | 12/2005 | Kellar et al. |
| 7,037,804 | B2 | 5/2006 | Kellar et al. |
| 7,056,807 | B2 | 6/2006 | Kellar et al. |
| 7,087,538 | B2 | 8/2006 | Staines et al. |
| 7,105,917 | B2 | 9/2006 | Cho et al. |
| 7,151,009 | B2 | 12/2006 | Kim et al. |
| 7,157,787 | B2 | 1/2007 | Kim et al. |
| 7,215,033 | B2 | 5/2007 | Lee et al. |
| 7,276,799 | B2 | 10/2007 | Lee et al. |
| 7,279,795 | B2 | 10/2007 | Periaman et al. |
| 7,307,005 | B2 | 12/2007 | Kobrinsky et al. |
| 7,317,256 | B2 | 1/2008 | Williams et al. |
| 7,320,928 | B2 | 1/2008 | Kloster et al. |
| 7,345,350 | B2 | 3/2008 | Sinha |
| 7,394,161 | B2 | 7/2008 | Kuo et al. |
| 7,402,442 | B2 | 7/2008 | Condorelli et al. |
| 7,402,515 | B2 | 7/2008 | Arana et al. |
| 7,410,884 | B2 | 8/2008 | Ramanathan et al. |
| 7,432,592 | B2 | 10/2008 | Shi et al. |
| 7,494,845 | B2 | 2/2009 | Hwang et al. |
| 7,528,494 | B2 | 5/2009 | Furukawa et al. |
| 7,531,890 | B2 | 5/2009 | Kim |
| 7,557,597 | B2 | 7/2009 | Anderson et al. |
| 7,576,435 | B2 | 8/2009 | Chao |
| 7,741,714 | B2 | 6/2010 | Huang et al. |
| 7,834,450 | B2 | 11/2010 | Kang |
| 8,232,113 | B2 | 7/2012 | Coffy |
| 8,558,229 | B2 * | 10/2013 | Jeng et al. .................... 257/48 |
| 2007/0164279 | A1 * | 7/2007 | Lin .................. H01L 22/32 257/48 |
| 2008/0169539 | A1 * | 7/2008 | Fang et al. ................... 257/676 |
| 2009/0008783 | A1 | 1/2009 | Saigoh et al. |
| 2009/0079094 | A1 * | 3/2009 | Lin .............................. 257/778 |
| 2009/0243118 | A1 * | 10/2009 | Akiba et al. ................. 257/773 |
| 2010/0230810 | A1 * | 9/2010 | Kang et al. .................. 257/737 |
| 2011/0092064 | A1 | 4/2011 | Liu et al. |
| 2012/0206160 | A1 | 8/2012 | Wu et al. |
| 2013/0026629 | A1 * | 1/2013 | Nakano ............ H01L 23/3192 257/737 |

FOREIGN PATENT DOCUMENTS

| | | |
|---|---|---|
| TW | 200905844 | 2/2009 |
| TW | 201128753 | 8/2011 |

* cited by examiner

PASSIVATION LAYER FOR PACKAGED CHIP

PRIORITY CLAIM

The present application is a continuation of U.S. application Ser. No. 13/313,747, filed Dec. 7, 2011, the disclosure of which is incorporated herein by reference in its entirety.

RELATED APPLICATION

The present application is related to U.S. application Ser. No. 13/025,931, entitled "Testing of Semiconductor Chips with Microbumps," and filed on Feb. 11, 2011. The above-mentioned patent application is incorporated herein by reference in its entirety.

FIELD

This disclosure relates generally to integrated circuits, and more particularly to forming a protective layer for packaged devices.

BACKGROUND

Integrated circuits have experienced continuous rapid growth due to constant improvements in the integration density of various electronic components (i.e., transistors, diodes, resistors, capacitors, etc.). For the most part, this improvement in integration density has come from repeated reductions in minimum feature size, allowing more components to be integrated into a given chip area.

The volume occupied by the integrated components is near the surface of the semiconductor wafer. Although dramatic improvements in lithography have resulted in considerable improvements in two-dimensional (2D) integrated circuit formation, there are physical limitations to the density that can be achieved in two dimensions. One of these limitations is the minimum size needed to make these components. Further, when more devices are put into one chip, more complex designs are required.

Three-dimensional integrated circuits (3DIC) were thus formed to address issues raised by increase in circuit densities. The dies are stacked, with wire-bonding, flip-chip bonding, and/or through-silicon vias (TSV) being used to stack the dies together and to connect the dies to package substrates.

BRIEF DESCRIPTION OF THE DRAWINGS

The present disclosure will be readily understood by the following detailed description in conjunction with the accompanying drawings, and like reference numerals designate like structural elements.

DETAILED DESCRIPTION

Figure 1A:
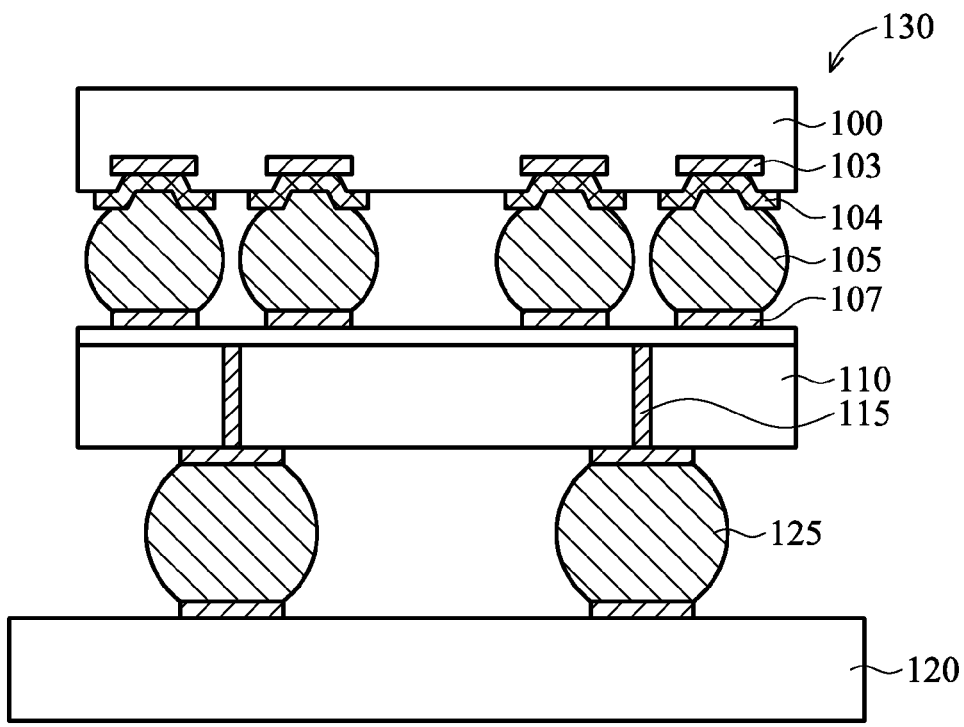
FIG. 1A shows a schematic diagram of a three dimensional (3D) integrated circuit (IC) involving a packaged semiconductor chip, in accordance with some embodiments.

It is to be understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Modern integrated circuits are made of millions of active devices, such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through these bond pads to connect the chip to a package substrate or another die. In some embodiments, bond pads are used for wire bonding or flip-chip bonding. Flip-chip packaging utilizes bumps to establish electrical contact between a chip's I/O pads and the substrate or lead frame of the package.

FIG. 1A shows a schematic diagram of a three dimensional (3D) integrated circuit (IC) 130 involving a packaged semiconductor chip 100, in accordance with some embodiments. The IC chip 100 has integrated circuits connected by interconnect (not shown) and is packaged with flip-chip packaging by forming bumps 105 on the front-side of the IC chip 100. Bumps 105 electrically and possibly physically contact the input/output (I/O) pads (metal pads) 103 of the IC chip 100. In some embodiments, there is an under bump metallurgy (UBM) layer 104 between the bumps 105 and the metal pads 103. The IC chip 100 with the bumps 105 is flipped over to be placed on a package substrate 110. In some embodiments, a surface of substrate 110 has metal pads 107 to receive the bumps 105. In some embodiments, substrate 110 is an interposer, which includes through silicon vias (TSVs) 115, and is bonded to another substrate 120 via solder balls 125. In some embodiments, the space between and around the IC chip 100, the bumps 105 and the substrate 100 are filled with an under-fill material (not shown). The embodiment shown in FIG. 1A is merely an example. Other embodiments are also possible. In some embodiments, the IC chip 100 with bumps 105 is applied on other types of substrates, such as an application board, and a substrate with embedded passive and/or active devices.

As feature size scales down, the number of transistors and interconnects on a chip has increased continuously. As a result, the number of chip to package input/output (I/O) interconnects has also increased significantly. With the increased chip to package I/O interconnects, the sizes (or widths) of bumps 105 is reduced to equal to or less than about 50 μm. Such reduced-size bumps are called "microbumps."

Figure 1B:
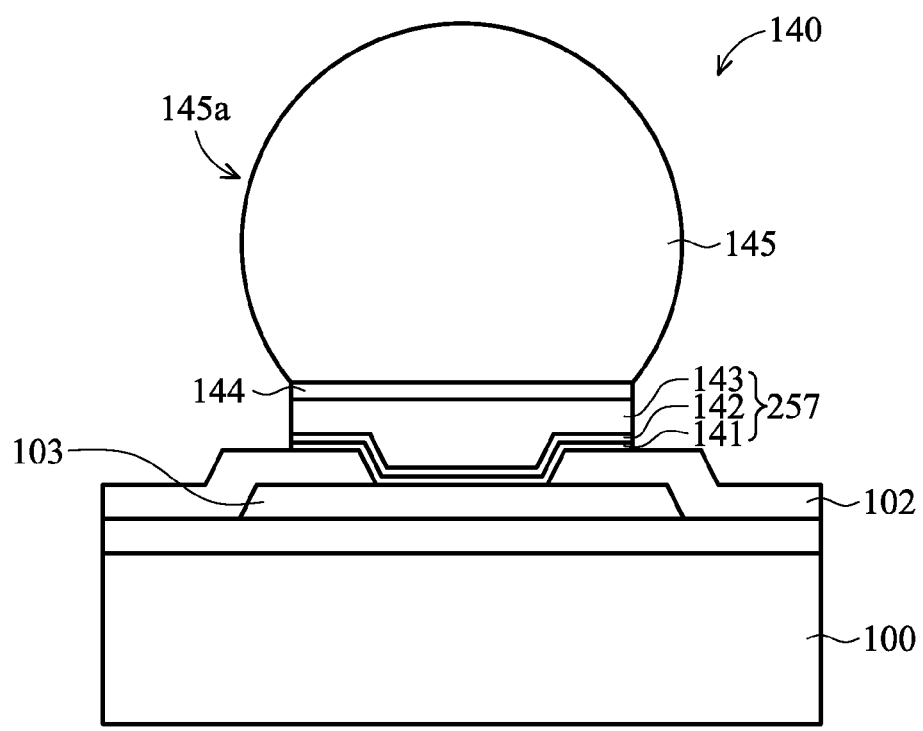
FIG. 1B illustrates a structure of a microbump on a substrate, in accordance with some embodiments.

In some embodiments, the structures of microbumps and the processes of forming the microbumps are similar to regular bumps. FIG. 1B illustrates a bump structure 140 of a microbump on a substrate, in accordance with some embodiments. FIG. 1B shows a bump structure 140 on an IC chip 100, in accordance with some embodiments. Metal pad 103, which is used as bump pad, is formed over one or more interconnect structures (not shown).

In some embodiments, the IC chip 100 includes a semiconductor substrate, such as a silicon substrate, although it may include other semiconductor materials such as silicon germanium, silicon carbon, gallium arsenide, or the like. In some embodiments, active devices such as transistors (not shown) are formed at the surface of the semiconductor substrate. Interconnect structures (not shown), which include metal lines and vias (not shown) formed therein and electrically coupled to the semiconductor devices, is formed over semiconductor substrate. In some embodiments, the metal lines and vias are formed in dielectric layers, which are made of various dielectric materials, such as low-k dielectric layers having dielectric constants (k values) less than about 3.5. In some embodiments, the dielectric layers include an extreme low-k dielectric layer having k values less than about 2.5. In some embodiments, one or more of the dielectric layers are made of at least one material, such as silicon oxide, e.g., undoped silicate glass (USG), boron-doped silicate glass (BSG), phosphor-doped silicate glass (PSG), boron-phosphor-doped silicate glass (BPSG), or the like, silicon oxy-nitride, silicon nitride, and/or any combinations thereof. In some embodiments, a multiple-layer dielectric is used as one of the dielectric layers. In some embodiments, the formation methods include chemical vapor deposition (CVD), plasma-enhanced CVD (or PECVD), spin-on, and other applicable methods.

In some embodiments, the metal pad 103 is formed over the interconnect structure and comprises aluminum, and hence may also be referred to as aluminum pad 103. In some embodiments, the metal pad 103 is also formed of, or includes, other materials, such as copper, silver, gold, nickel, tungsten, alloys thereof, and/or multi-layers thereof. In some embodiments, the metal pad 103 is electrically coupled to the semiconductor devices, for example, through the underlying interconnect structure.

In some embodiments, a passivation layer 102 is formed to cover edge portions of metal pad 103. Passivation layer 102 is formed to protect the integrated circuits formed in the IC chip 100 and also the edge portions of metal pad 102. In some embodiments, the passivation layer 102 is also a hermetic layer to prevent moisture from contacting the devices. In some embodiments, the passivation layer 102 is formed of nitride, oxide, oxynitride, polymer (such as polyimide or polybenzoxazole) or other dielectric materials. In some embodiments, passivation layer 102 is also formed of a combination of dielectric materials. In some embodiments, additional passivation layers are formed over the interconnect structures (not shown) and at the same level, or over, metal pad 103. In some embodiments, the passivation layer 102 has a thickness in a range from about 3,000 Å to about 15,000 Å. In some embodiments, the formation methods include chemical vapor deposition (CVD), plasma-enhanced CVD (or PECVD), spin-on, and other applicable methods.

An opening is formed in the passivation layer 102, with the metal pad 103 exposed. An UBM layer 257 is deposited over the substrate 100. In some embodiments, the thickness of the UBM layer 257 is in a range from about 2 μm to about 10 μm. In some embodiments, UBM layer 257 includes a diffusion barrier layer 141 and a seed layer 142. The diffusion barrier layer also functions as an adhesion layer (or a glue layer), in some embodiments. In some embodiments, the diffusion barrier layer 141 is formed of tantalum nitride. In some embodiments, the diffusion barrier layer 141 is also formed of other materials such as titanium nitride, tantalum, titanium, or the like. In some embodiments, the thickness of the diffusion barrier layer 141 is in a range from about 200 Å to about 2000 Å. In some embodiments, the formation methods include physical vapor deposition (PVD) (or sputtering). In some embodiments, the seed layer 142 is a copper seed layer formed on the diffusion barrier layer 141. In some embodiments, the copper seed layer 142 is formed of copper or one of copper alloys that include silver, chromium, nickel, tin, gold, and combinations thereof. The thickness of the copper seed layer is in a range from about 2000 Å to about 8000 Å, in accordance with some embodiments. In some embodiments, UBM layer 42 includes a diffusion barrier layer formed of Ti and a seed layer formed of Cu. In some embodiments, both the diffusion barrier layer and the seed layer are deposited by physical vapor deposition (PVD) (or sputtering) methods.

In some embodiments, the UBM layer 257 further includes a copper layer 143. In some embodiments, the copper layer 143 has a thickness in a range from about 10,000 Å (or 1 μm) to about 100,000 Å (or 10 μm). In some embodiments, the copper layer 143 is deposited by a plating process. In some embodiments, an optional nickel (Ni) layer (or a nickel-containing layer) 144 is deposited over the copper layer 143. The Ni layer 144 prevents the formation of inter-metallic compound, which is formed between copper and solder. The optional Ni layer has a thickness in a range from about 10,000 Å to about 50,000 Å, in accordance with some embodiments.

A solder layer 145 is formed on nickel layer 144, for example, by plating. Alternatively, in some embodiments, solder layer 145 is replaced by a copper post (or copper pillar), which is formed by plating. In some embodiments, additional layers, such as a nickel layer and a solder layer, are formed over the copper post. In some embodiments, solder layer 145 is a lead-free pre-solder layer formed of, for example, SnAg, or a solder material, including alloys of tin, lead, silver, copper, nickel, bismuth, or combinations thereof. Excess UBM layer 257, which is not underneath the solder layer 145, is removed afterwards. A solder reflowing process is performed to form solder bump 145a, as shown in FIG. 1B. If a copper post is used in place of the solder layer 145, in some embodiments, a solder layer over the copper post is reflowed. In some embodiments, solder layer 145 has a thickness in a range from about 100 μm to about 400 μm. In some embodiments, solder layer 145 is plated on the UBM layer 257.

Further details of bump formation process are found in U.S. patent application Ser. No. 12/842,617, filed on Jul. 23, 2010 and entitled "Preventing UBM Oxidation in Bump Formation Processes," and U.S. patent application Ser. No. 12/846,353, filed on Jul. 29, 2010 and entitled "Mechanisms for Forming Copper Pillar Bumps," both of which are incorporated herein in their entireties.

FIG. 1A shows that IC chip 100 (a flipped chip) is disposed on a substrate 110, which has through silicon vias 115 for assisting heat dissipation and/or electrical connection, in accordance with some embodiments. In some embodiments, the silicon substrate 320 has active devices on the substrate 110. In other embodiments, the silicon substrate 320 does not have active devices on the substrate 110. The IC chip 100 is connected to substrate 110 via microbumps 105. The substrate 110 is placed on another package substrate 120, with bumps 125, which, in some embodiments, are larger than the microbumps 105.

After the IC chip 100 is packaged, and before it is placed on substrate 110, it is desirable to perform electrical tests on chip 100 to determine if the circuits on chip 100 meet the specification of functional tests. If the test results show problems with the IC chip 100, the IC chip 100 is discarded and another IC chip 100 is used instead. Such screening prevents the entire package shown in FIG. 1A from being discarded and can increase package yield, resulting in cost-saving.

Conventionally, the sizes of the flip chip bumps are equal to or greater than about 75 μm. The sizes of the conventional flip chip bumps allow the semiconductor chips connected to the bumps to be electrically tested to determine whether the circuits under (or connected) to the bumps pass functional tests. In some embodiments, the functional tests are called circuit probe (CP), or electronic die sort (EDS).

Conventional flip chip bumps, with sizes equal to or greater than about 75 μm, allow circuit probing (or electrical tests). However, the current circuit probes are too large for microbumps (or μbumps). For example, the sizes (or widths) of the tips of probes are in a range from about 2.5 mil to about 5 mil, which are too large for microbumps. An alternative for testing semiconductor chips with microbumps is to use test pads.

Figure 2A:
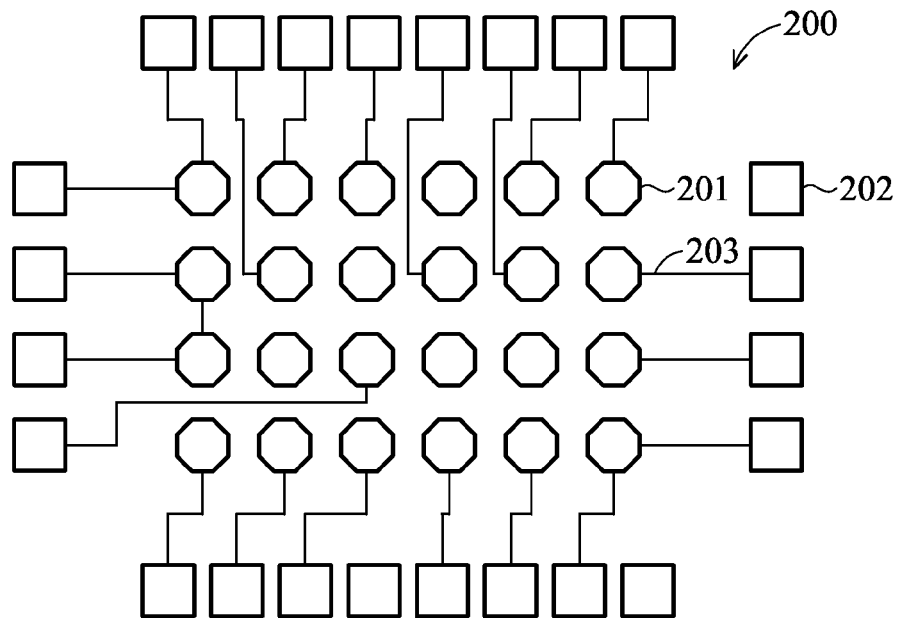
FIG. 2A shows a top schematic view of a portion of a semiconductor substrate with bumps, in accordance with some embodiments.

FIG. 2A shows a top schematic view of a portion 200 of a semiconductor substrate (or chip) with bumps, in accordance with some embodiments. The metal pads (or bump pads) 201 under bumps are represented by octagons in FIG. 2A. However, the octagonal shape is merely exemplary. Other shapes are also possible. As shown in FIG. 1A, bumps 105 are placed directly above metal pads 103, which are similar to metal pads 201. There are a number of test pads 202 surrounding the metal pads 201 (and bumps above them). The test pads are connected to the metal pads via conductive lines 203. In some embodiments, the conductive lines are redistribution lines (RDLs), which are formed above the metal pads under the bumps, metal lines, or post-passivation interconnects (PPI). In some embodiments, the test pads 202 are at the same or at different level as the conductive lines 203. In some embodiments, the test pads 202 are connected to different bumps 201 to perform functional tests.

Circuit probing can damage the metal pads, which leads to the copper seed layer coverage and poor bump plating (or formation). Poor bump formation leads to particle and corrosion issues. However, if the testing pads are covered by a passivation layer after the testing is completed, the risks of such issues are completed resolved or greatly reduced.

Figure 2B:
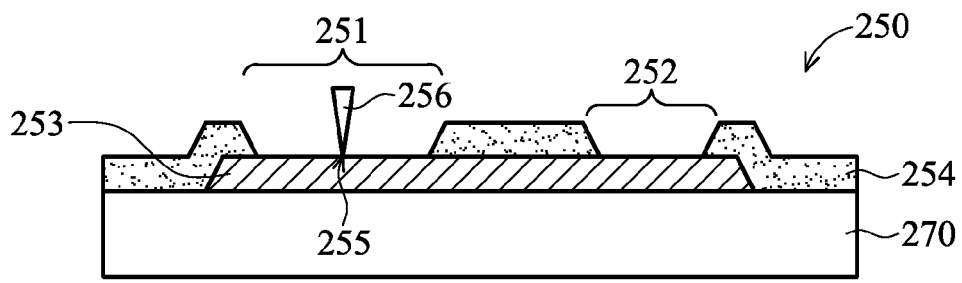
FIG. 2B illustrates a cross-sectional view of a region including a testing pad region and a metal pad region on a substrate, in accordance with some embodiments.

FIG. 2B illustrates a cross-sectional view of a region 250 including a testing pad region 251 and a metal pad region 252 on a substrate 270, in accordance with some embodiments. The metal pad region 252 correlates to one of the metal pads 201 of FIG. 2A and the test pad region 251 correlates to one of the test pads 202 of FIG. 2A, in accordance with some embodiments. The metal pad region 252 is used to form a bump.

Both the test pad region 251 and the metal pad region 252 are formed of a metal pad layer 253, which is a top metal layer, a redistribution layer (RDL), or a post passivation interconnect (PPI) layer, in accordance with some embodiments. Metal pad region 252 and test pad region 251 are electrically and physically connected, in accordance with some embodiments. However, in some embodiments, both regions (regions 251 and 252) are electrically and physically separated from each other as well.

FIG. 2B shows that the test region 251 and the metal pad region 252 are defined by a first passivation layer 254 through lithographical patterning. The first passivation layer 254 is deposited over the metal pad layer 253. The outline(s) of the conductive line(s) 203 (see FIG. 2A) between test pad and microbump pad(s) are also defined by the first passivation layer, which is not shown in FIG. 2B. The first passivation layer 254 is similar to passivation layer 102 described above, in accordance with some embodiments. In some embodiments, the first passivation layer 254 is formed of nitride, oxide, oxynitride, polymer (such as polyimide or polybenzoxazole) or other dielectric materials. In some embodiments, the first passivation layer 254 is formed of a combination of dielectric materials.

FIG. 2B shows a probe 256 touching the test pad region 251. The probing causes damage in region 255 on a surface of the test pad region 251. The probing in test pad region 251 allows electrical data related to devices connected to regions 251 to be tested. As mentioned above, the regions for forming microbumps that are connected to the test pad could be in a range from 1 to many.

Figure 2C:
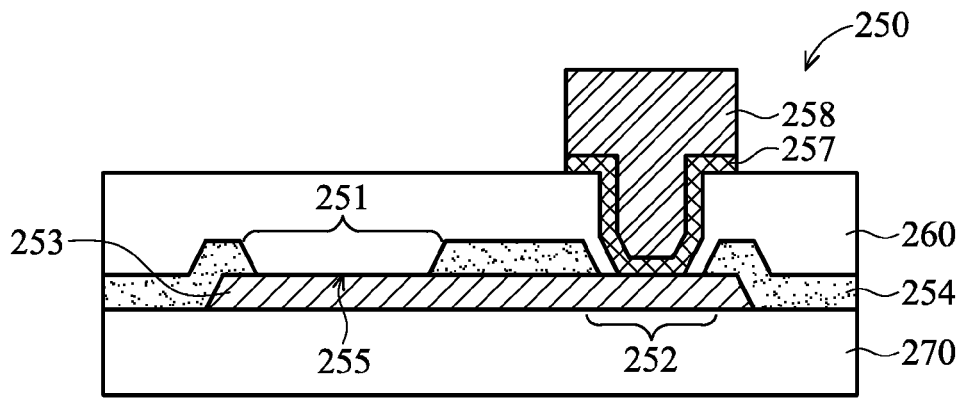
FIG. 2C shows a microbump formed on the substrate of FIG. 2B after a second passivation layer is formed, in accordance with some embodiments.

FIG. 2C shows a microbump 258 formed over the substrate of FIG. 2B after a second passivation layer 260 is formed, in accordance with some embodiments. FIGS. 2B and 2C show only one testing pad region 251 and one microbump 258 in region 250. In some embodiments, more than one testing pad regions similar to region 251 and more microbumps similar to microbump 258 are on substrate 270.

Figure 2D:
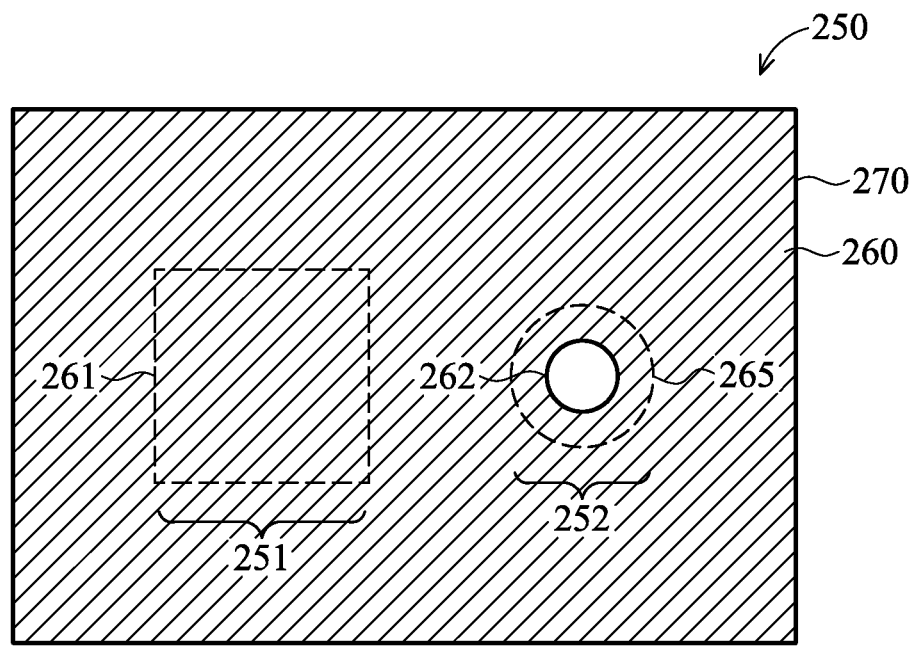
FIG. 2D shows a top view of a region including a testing pad region and a metal pad region after the deposition of a second passivation layer, in accordance with some embodiments.

FIG. 2D shows a top view of region 250 including the testing pad region 251 and the metal pad region 252 after the deposition of the second passivation layer 260, in accordance with some embodiments. FIG. 2D shows a dotted outline 261 of the testing pad region 251 and also a solid outline 262 of the bottom of the metal pad region 252, which is not covered by the second passivation layer 260. The boundary of the microbump 258 is marked by a dotted circle 265. The surface of substrate 270 is covered by the second passivation layer 260. The second passivation layer 260 is made of a polymer layer, in accordance with some embodiments. Exemplary polymers for forming the second passivation layer 260 include polyimide or polybenzoxazole.

After the probing is completed and the second passivation layer 260 is deposited and patterned, microbump 258 are formed on regions 252. The UBM layer 257 is formed under microbump 258. The microbump 258 is formed over the UBM layer 257 by plating, in accordance with some embodiments. Prior to plating the microbump 258, a photoresist layer, which is either a wet photoresist layer or a dry photoresist layer (not shown in FIG. 2C), is patterned over the second passivation layer 260 to define of the microbump 258 above regions 252. In some embodiments, the microbumps are made of various materials, such as solder or copper. After the microbumps are deposited, the photoresist layer and excess UBM layer (not under microbump 258) are removed. In some embodiments, the substrate 270 then undergoes a reflow process. The solder layer in the microbump 258 becomes rounded after the reflow process.

The UBM layer 257 is under the microbumps to provide a diffusion barrier and to enhance adhesion. The exemplary structure of microbumps with details of the UBM layer 257 is described above, and is shown in FIG. 1B. The formation of the UBM layer 257 involves deposition, patterning and etching the UBM layer. As described above, in some embodiments, the UBM layer 257 includes a diffusion barrier layer 141, a thin seed layer 142, a copper layer 143, and a metal layer 144. In some embodiments, the diffusion barrier layer 141 and the thin seed layer 142 are deposited by sputtering, which is also called physical vapor deposition (PVD). Physical vapor deposition involves sputter bombardment of metal target to remove metallic elements from the target to deposit on the substrate. During the sputter bombardment process, the organic compound(s) in the second passivation layer 260 are removed from the second passivation film and re-deposited on the surface 271 in the opening of region 252. The re-deposited organic compounds increase the resistance at the interface between the metal pad layer 253 and the UBM layer 257. In addition, in some embodiments, prior to the sputtering process to deposit the diffusion barrier layer 141, substrate 270 undergo a pre-deposition treatment, such as Ar sputtering, to remove an oxidized surface layer or contaminants from the surface of metal pad layer 253 in the opening of region 252 prior to the UBM layer deposition. Similar to the sputtering effect of PVD, Ar sputtering also removes the organic compound(s) in the second passivation layer 260 and the removed organic compounds are deposited on surface 271 in the opening of region 252.

Figure 2E:
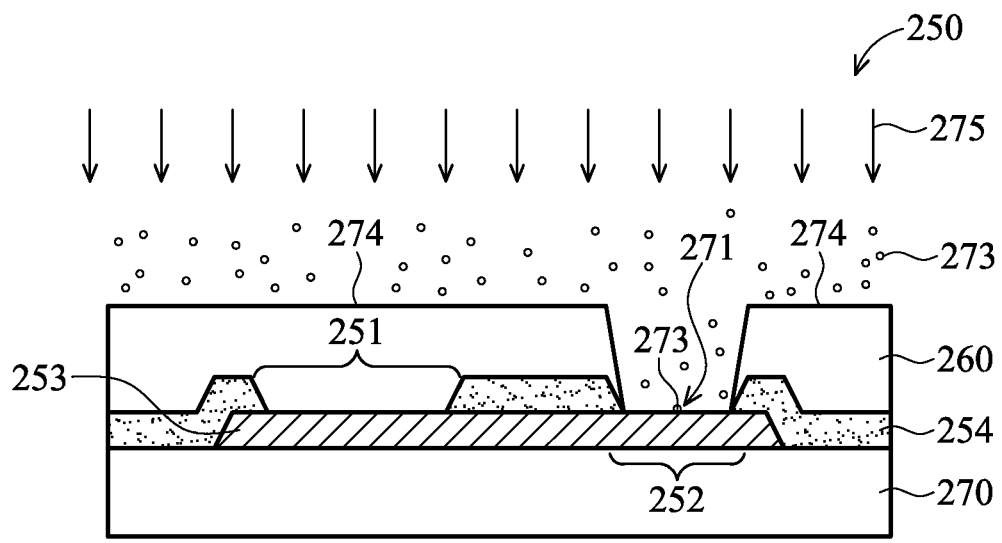
FIG. 2E shows a substrate undergoing a sputtering process, in accordance with some embodiments.

FIG. 2E shows the substrate 270 undergoing a sputtering process, in accordance with some embodiments. In some embodiments, the sputtering process is a physical vapor deposition (PVD) process, or an Ar-sputtering process. FIG. 2E shows sputtering ions 275, such as Ar ions, striking the surface of the substrate 270, which includes a surface 274 of the second passivation layer 260 and a surface 271 in the opening of region 252. FIG. 2E also shows the sputtering ions cause the organic compound(s) 273 in the second passivation layer 260 to emit from the second passivation layer 260 and deposit on the surface 271 in the opening of region 252. The deposited organic compound(s) 273 causes an increase in resistivity of the UBM layer 257, to be formed afterwards. As shown in FIG. 2D, the majority of the surface of substrate 270 is covered by the second passivation layer 260. Therefore, a significant amount of the organic compound(s) 273 is emitted in the process chamber during the sputtering process.

Figure 3A:
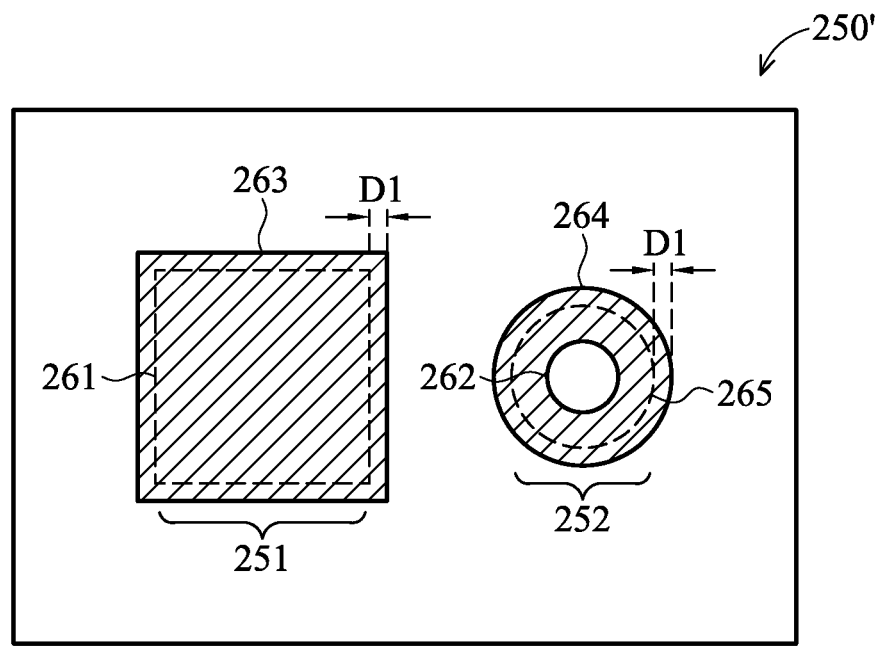
FIG. 3A shows a top view of a region after the deposition of a passivation layer, in accordance with some embodiments.

FIG. 3A shows a top view of region 250' including the testing pad region 251 and metal pad region 252 after the deposition of the second passivation layer 260, in accordance with some embodiments. FIG. 3A shows an outline 263 of the second passivation layer 260 covering the dotted outline 261 of the testing pad region 251. The distance between outline 263 and outline 261 is $D_1$. In some embodiments, $D_1$ is equal to or greater than about 0. In some embodiments, $D_1$ is in a range from about 2 μm to about 15 μm. The outline of the testing pad region 251 in FIG. 3A is a rectangle. However, it is merely exemplary. In some embodiments, the testing pad region 251 is other shapes, such as square, circle, oval, triangle, and other applicable shapes.

FIG. 3A also shows an outline 264 of the second passivation layer 260 covering the dotted outline 262 of the metal pad region 252, defining a boundary 265, in accordance with some embodiments. The distance between the outline 264 and the boundary 265 of the microbump 258 is $D_2$. In some embodiments, $D_2$ is equal to or greater than about 0. In some embodiments, $D_2$ is equal to or greater than about 0.1 μm. The boundary 265 and the outline 262 of the metal pad in FIG. 3A are circles. However, it is merely exemplary. In some embodiments, the testing pad region 251 is other shapes, such as elongated circle, oval, and other applicable shapes.

The second passivation layer 260 of FIG. 3A only covers the testing pad region 251 and the metal pad region 252 and leaves the rest of the substrate surface un-covered. The limited coverage of the second passivation layer 260 on substrate 270 reduces the organic compound(s) 273 emitted during the sputtering process(es) and the risk of increased resistance at the interface 271 of the UBM layer 257.

Figure 3B:
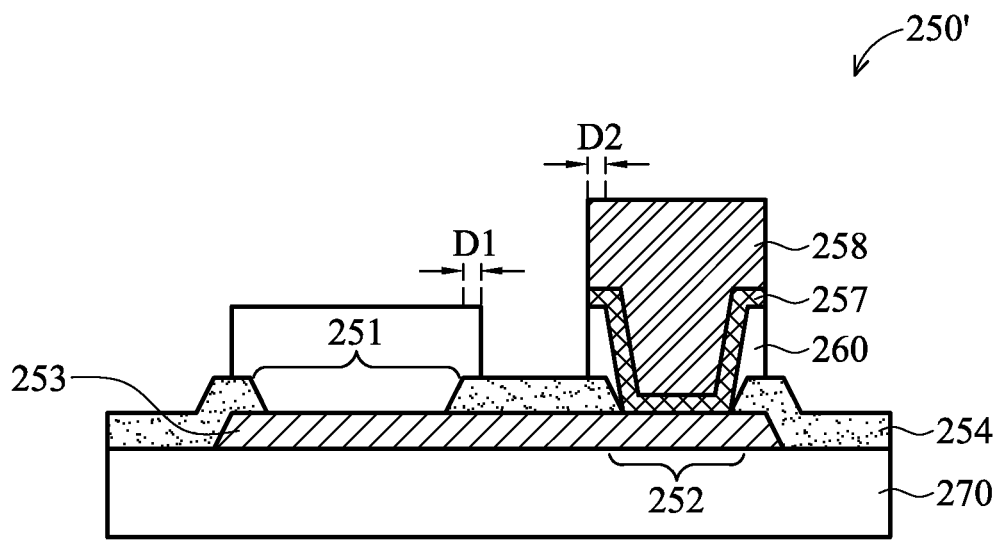
FIG. 3B shows a cross-sectional view of the region of FIG. 3A, in accordance with some embodiments.

FIG. 3B illustrates a cross-sectional view of a region 250' including the testing pad region 251 and the metal pad region 252 on the substrate 270, in accordance with some embodiments. FIG. 3B shows the limited coverage of the second passivation layer 260 over the test pad region 251 and the metal pad region 252 to limit the emission of the organic compound(s) 273 and the re-deposition of the organic compound(s) 273 on the surface 271 of the opening of the metal pad region 252 during sputtering process(es). The UBM layer 257 and microbump 258 are formed over the metal pad region 252. Due to limited exposure to organic compound(s) 273, an interface under the UBM layer 257 is substantially clean and the sheet resistance of the UBM layer 257 is low in comparison to arrangements having larger second passivation layers.

Figure 3C:
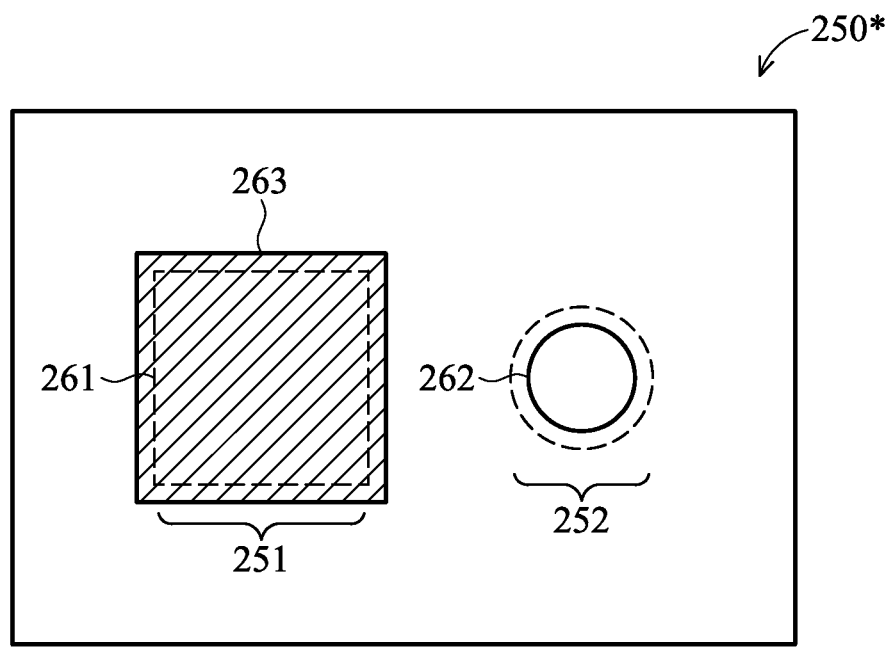
FIG. 3C shows a top view of a region after the deposition of a passivation layer, in accordance with some embodiments.

Bump structures often suffer from stress issues, which could cause interfacial delamination and solder cracking. FIG. 3C shows a top view of region 250* including the testing pad region 251 and the metal pad region 252 after the deposition of the second passivation layer 260, in accordance with some embodiments. For the microbump 258 that does not have stress issues, the second passivation layer 260 is not formed under the microbump 258 to provide a stress cushion. Therefore, the second passivation layer 260 is only formed to cover the testing pad region 251, as shown in FIG. 3C. FIG. 3B shows the testing pad under the testing pad region 251 and the metal pad under the metal pad region 252 are connected. Alternatively, in some embodiments, the testing pad under the testing pad region 251 and the metal pad under the metal pad region 252 are physically and/or electrically separated.

Figure 3D:
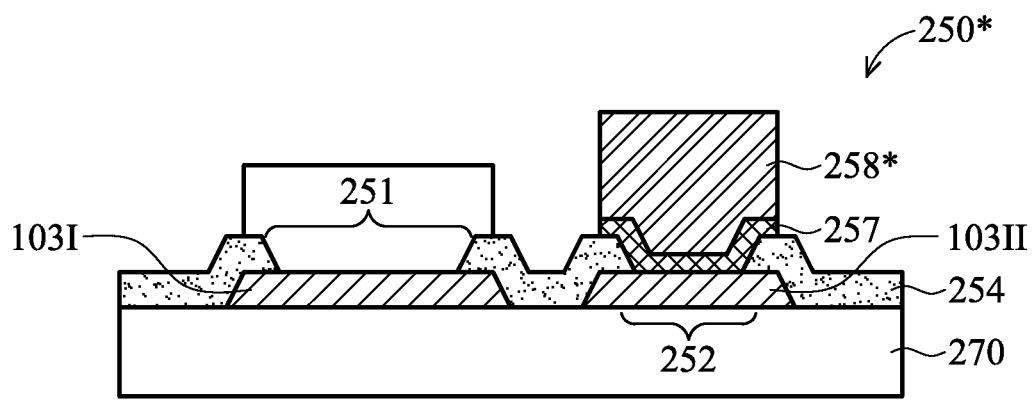
FIG. 3D shows a cross-sectional view of the region of FIG. 3C, in accordance with some embodiments.

FIG. 3D shows a testing pad $103_I$ in the testing pad region 251 and a metal pad $103_{II}$ in the metal pad region 252 separated from each other, in accordance with some embodiments. In some embodiments, the testing pad $103_I$ is connected to another metal pad or to a different bump (not the bump in FIG. 3D). Alternatively, in some embodiments, testing pad $103_I$ and metal pad $103_{II}$ is at different metal level. For example, in some embodiments, the testing pad $103_I$ is at top metal level and the metal pad $103_{II}$ is at a PPI level. In some embodiments, the testing pad $103_I$ is electrically and physically connected to metal pad $103_{II}$ via interconnecting structures. Further, the second passivation layer 260 is not under microbump 258* in FIG. 3D, which is similar to the case in FIG. 3C.

Although the description above is for formation microbumps, the mechanisms of forming using limited or no second passivation layer on the substrate surface to reduce emission of organic compound(s) during sputtering process (es) of UBM layer formation also applies to regular bumps.

Figure 4:
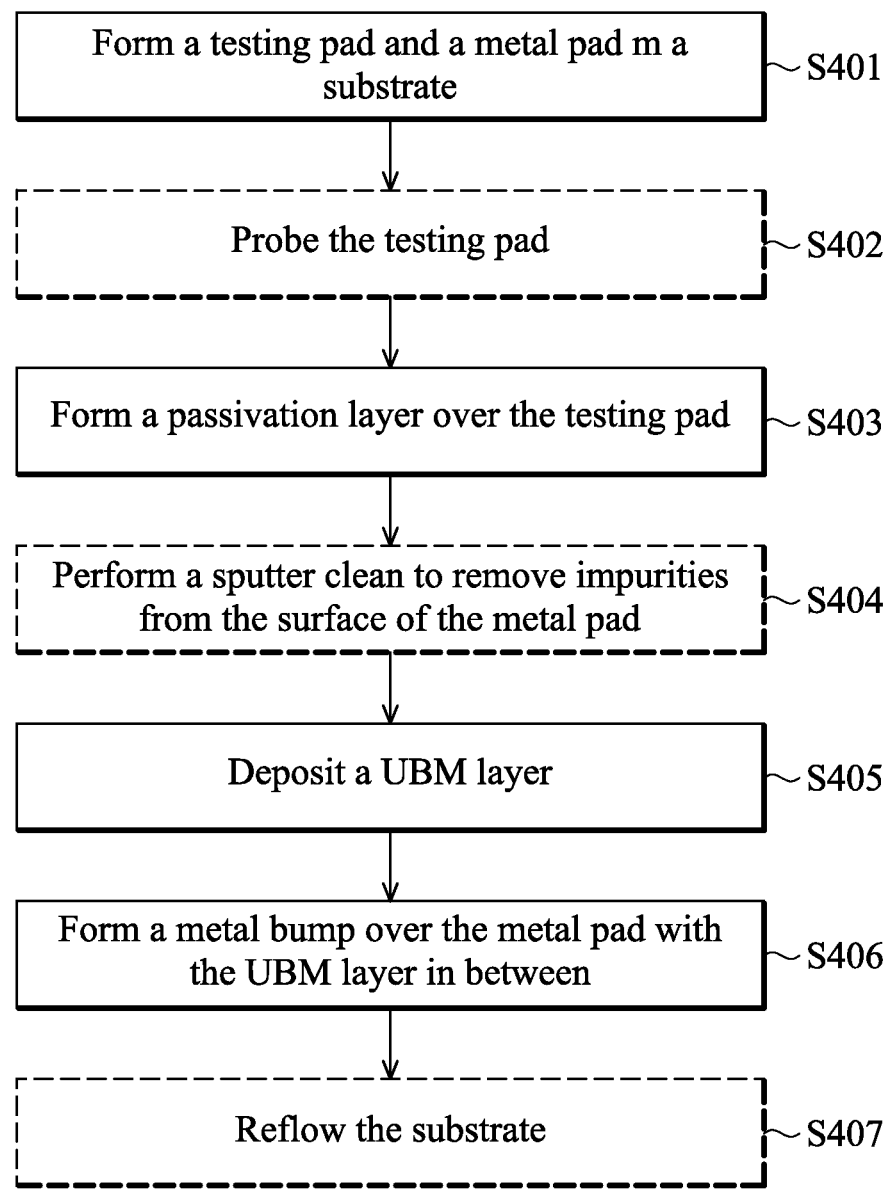
FIG. 4 illustrates a process flow of forming bumps on a substrate, in accordance with some embodiments.

FIG. 4 illustrates a process flow of forming bumps on a substrate, in accordance with some embodiments. At operation 401, a testing pad and a metal pad are formed on a substrate. In some embodiments, more than one testing pad and more then one metal pad are formed on the substrate. The metal pads are used to form metal bumps. As mentioned above, in some embodiments, the substrate includes devices and interconnects over the substrate. The testing pad and the metal pad are connected, in some embodiments. The testing pad is similar to the testing pad $103_I$ of FIG. 3D and the metal pad is similar to the metal pad $103_{II}$. As mentioned above, in some embodiments, the testing pad $103_I$ and the metal pad $103_{II}$ are connected to one another to become metal pad layer 253 of FIGS. 2B, 2C, 2Em and 3B. As described above, in some embodiments, the testing pad $103_I$ and the metal pad $103_{II}$ are defined by the patterned first passivation layer 254. The edges of the testing pad $103_I$ and the metal pad $103_{II}$ are covered by the first passivation layer 254.

At an optional operation 402, the testing pad $103_I$ is probed to test electrical functionalities of the integrated circuit connected to the testing pad. Afterwards, at operation 403, a passivation layer is formed and patterned on the substrate to cover at least the testing pads, such as testing pad $103_I$, to prevent particle and corrosion issues as described above. In some embodiments, the passivation layer of operation 403 is the second passivation layer 260. In some embodiments, the second passivation layer 260 also covers a portion of the metal pad to provide cushion (or stress relief) for the metal bump. In some embodiments, the second passivation layer 260 is formed to cover the testing pad and possibly the metal pad. The surface of the substrate not occupied by either testing pads or metal pads is left un-covered by the second passivation layer 260 to limit the emission of organic compounds during the following sputtering process(es).

After the passivation layer is formed, an optional sputtering (or sputter clean) operation, such as operation 404 in FIG. 4, can be performed to remove surface layer from the metal pad. The optional sputtering, such as Ar sputtering, is used to remove surface oxide layer, impurities, or residues to expose the conductive layer (metal pad) underneath.

Afterwards, a UBM layer is deposited on the substrate, at operation 405. As described above, in some embodiments, the UBM layer 257 is formed of a number of layers, including the diffusion barrier layer 141 and the seed layer 142. Both the diffusion barrier layer 141 and the seed layer 142 are deposited by PVD (or sputtering) processes.

Following the deposition of the UBM layer, a metal bump is formed over the metal pad, at operation 406. The UBM layer is between the metal bump and the metal pad. As mentioned above, in some embodiments, the metal bump is formed by a plating process. Prior to forming the metal bump, in some embodiments, a photoresist layer is deposited and patterned over the UBM layer to allow the metal bump to be formed above and around the metal pad. Once the metal bump is formed, the photoresist layer and the excess UBM layer, which is not under the metal bump and not covered by the second passivation layer, are removed. The metal bump is then reflowed at optional operation 407, in accordance with some embodiments.

Figure 5:
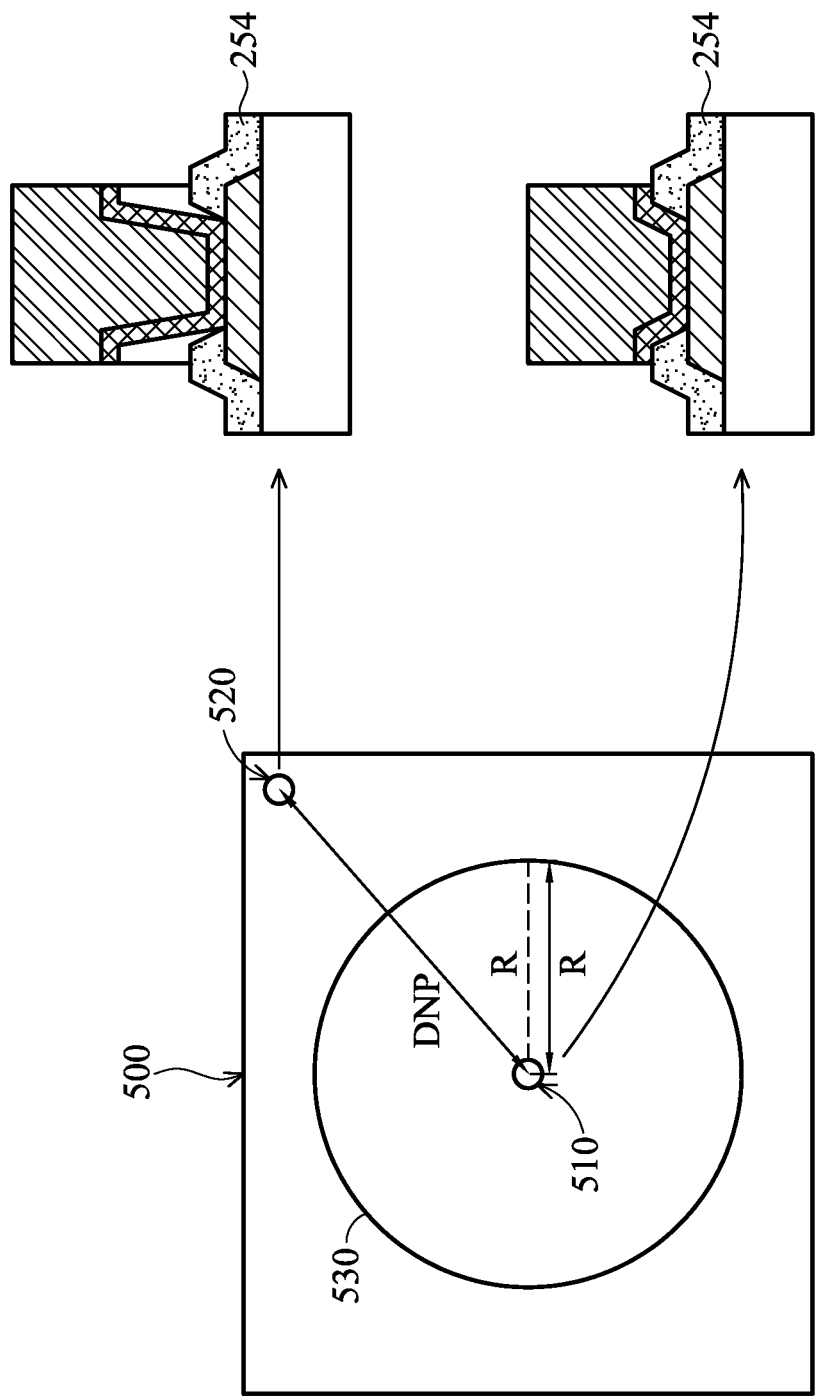
FIG. 5 shows a schematic top and cross-sectional views of a chip with a center bump and a corner bump, in accordance with some embodiments.

FIG. 5 shows a schematic top view of a chip 500 with a center bump 510 and a corner bump 520, in accordance with some embodiments. There are other bumps on chip 500 other than the bumps 510 and 520; however, they are not shown. The stresses on bumps on a chip depend on the distance of the bumps to the center of the chip (or die). Bumps at the center of the chip (or die) have the lowest stress. The distance of the corner bump 520 to the center of the chip (or the bump 510) is called distance to neutral point (DNP), since the center of the chip is considered a stress neutral point. On chip 500, the corner bump 520 has the highest stress and the center bump 510 has the lowest stress. Bumps on other locations with varying DNPs have different stress levels. High stress results in reliability and yield issues. As mentioned above, if the second passivation layer 260, which is a polymer layer, is placed under a microbump or a regular bump, the second passivation layer 260 acts as a cushion for the bump and can reduce stress caused by the bump location. For chips with bumps causing high stress, having the second passivation layer 260 under the bumps, as shown in FIGS. 3A and 3B, reduces reliability and yield issues. However, for chips without reliability and yield issues caused by bump locations, the second passivation layer under bumps is not necessary. For such chips, in some embodiments, the configuration shown in FIGS. 3C and 3D is used.

FIG. 5 shows that the center bump 510 uses the configuration without the second passivation layer 260 under the center bump 510 and corner bump 520 uses the configuration with the second passivation layer 260 under the corner bump 520, in accordance with some embodiments. In some embodiments, bumps in other locations with varying DNP and stress levels use one of the configurations. In some embodiments, bumps with larger DNPs and higher stresses have the second passivation layer 260 similar to the corner bump 520. FIG. 5 shows a circle 530 with radius R. Bumps outside radius R have second passivation layer 260 under bumps and bumps inside and on radius R do not have second passivation layer under bumps. In some embodiments, the bumps 510 and 520 are electrically connected to testing pads, as described above.

The embodiments described above provide mechanisms for forming metal bumps on metal pads with testing pads on a packaged integrated circuit (IC) chip. A passivation layer is formed to cover the testing pads and possibly portions of metal pads. The passivation layer does not cover surfaces away from the testing pad region and the metal pad region. The limited covering of the testing pads and the portions of the metal pads by the passivation layer reduces interface resistance for a UBM layer formed between the metal pads and the metal bumps. Such reduction of interface resistance leads to the reduction of resistance of the metal bumps.

One aspect of this description relates to a packaged integrated circuit (IC) chip. The packaged IC chip includes a testing pad, wherein the testing pad is electrically connected to devices in the packaged integrated circuit chip. The packaged IC chip further includes a first passivation layer over a portion of the testing pad, and a second passivation layer covering a surface of the testing pad and a portion of the first passivation layer surrounding the testing region of the testing pad. A distance between edges of the second passivation layer covering the surface of the testing pad to edges of the testing pad is in a range from about 2 mm to about 15 mm.

Another aspect of this description relates to a packaged integrated circuit (IC) chip. The packaged IC chip includes a metal pad electrically connected to devices in the packaged integrated circuit chip, the metal pad having a bump-formation area. The packaged IC chip further includes a testing pad, wherein the testing pad is electrically connected to the devices in the packaged integrated circuit chip, the testing pad having a testing region. The packaged IC chip further includes a passivation layer covering a surface of the testing pad and an area surrounding the testing region of the testing pad, and exposing a portion of the packaged integrated circuit chip between the metal bump and the testing pad.

Still another aspect of this description relates to a method of forming a packaged integrated circuit (IC) chip. The method includes forming a metal layer on a substrate. The method further includes forming a first passivation layer over the metal layer, wherein the first passivation layer defines a testing pad region and a metal pad region. The method further includes forming a second passivation layer over the first passivation layer, wherein the second passivation layer limitedly covers the testing pad region and a portion of the metal pad region, wherein the second passivation layer does not cover surfaces away from the testing pad region and the metal pad region.

Various modifications, changes, and variations apparent to those of skill in the art may be made in the arrangement, operation, and details of the methods and systems disclosed. Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the disclosure is not to be limited to the details given herein, but may be modified within the scope and equivalents of the appended claims.

What is claimed is:

1. A packaged integrated circuit (IC) chip, comprising:
   a pad layer electrically connected to the devices in the packaged integrated circuit chip, wherein the pad layer includes a testing pad region and a metal pad region;
   a first passivation layer over a first portion and a second portion of the testing pad region and having a first edge over the first portion of the testing pad region; and
   a second passivation layer covering a surface of the testing pad region interposing the first and second portions of the testing pad region, wherein the second passivation layer extends beyond the first edge of the first passivation layer that overlies over the first portion of the testing pad region by a distance in a range from about 2 μm to about 15 μm.

2. The packaged IC chip of claim 1, wherein the first passivation layer comprises at least one of silicon nitride, silicon oxide, silicon oxynitride, polyimide, or polybenzoxazole.

3. The packaged IC chip of claim 1, wherein the metal pad region is physically separated from the test pad region of the pad layer.

4. The packaged IC chip of claim 3, further comprising a microbump structure on the metal pad region, wherein the microbump structure comprises:
   a diffusion barrier layer over the metal pad region;
   a seed layer over the diffusion barrier layer;
   a copper layer over the seed layer; and
   a solder layer over the copper layer.

5. The packaged IC chip of claim 4, wherein the microbump structure further comprises a nickel layer between the copper layer and the solder layer.

6. The packaged IC chip of claim 5, wherein the nickel layer has a thickness ranging from about 10,000 angstroms (Å) to about 50,000 Å.

7. The packaged IC chip of claim 4, wherein the diffusion barrier layer has a thickness ranging from about 200 Å to about 2000 Å.

8. The packaged IC chip of claim 4, wherein the seed layer has a thickness ranging from about 2000 Å to about 8000 Å.

9. The packaged IC chip of claim 4, wherein the copper layer has a thickness ranging from about 1 micron (μm) to about 10 μm.

10. The packaged IC chip of claim 4, wherein the solder layer has a thickness ranging from about 100 μm to about 400 μm.

11. A packaged integrated circuit (IC) chip, comprising:
    a pad layer including:
       a metal pad region electrically connected to devices in the packaged integrated circuit chip, the metal pad region having a bump-formation area; and
       a testing pad region coplanar to and spaced a lateral distance from the metal pad region, wherein the testing pad region is electrically connected to the devices in the packaged integrated circuit chip, the testing pad region having a testing region;
    a passivation layer including a first contiguous portion and a second contiguous portion, wherein the first contiguous portion is disposed on a first edge of a top surface of the testing pad region, in the distance between the testing pad region and the metal pad region, and on a top surface of the metal pad region, and wherein the second contiguous portion is disposed over a second edge of the top surface of the testing pad region, opposing the first edge of the top surface of the testing pad region; and
    an additional passivation layer covering the top surface of the testing pad region exposed by an opening in the passivation layer between the first and second contiguous portions, wherein the additional passivation layer extends from a first sidewall over the first contiguous portion of the passivation layer to a second sidewall over the second contiguous portion of the passivation layer.

12. A method of forming a packaged integrated circuit (IC) chip, comprising:
    forming a metal layer on a substrate;
    defining a test pad region and a metal pad region of the metal layer;
    forming a first passivation layer over the metal layer, wherein the forming includes providing a first opening in the first passivation layer exposing the testing pad region and providing a second opening in the first passivation layer exposing the metal pad region; and
    forming a second passivation layer on the substrate;
    patterning the second passivation layer such that it has a contiguous portion extending over the first passivation layer and in the first opening, wherein the patterning the second passivation layer includes providing an opening in the second passivation layer between the metal pad region and the testing pad region, wherein the opening exposes the first passivation layer and wherein the contiguous portion completely covers the test pad region exposed by the first passivation layer and extends beyond an edge of the first passivation layer that overlies the test pad region by between 2 and 15 microns.

13. The method of claim 12, wherein the forming the first passivation layer comprises forming the first passivation layer comprising at least one of silicon nitride, silicon oxide, silicon oxynitride, polyimide, or polybenzoxazole.

14. The method of claim 12, wherein forming the first passivation layer comprises forming the first passivation using at using chemical vapor deposition (CVD), plasma-enhanced CVD (PE-CVD), or a spin-on process.

15. The method of claim 12, further comprising forming a microbump structure on the metal pad region, wherein forming the microbump structure comprises:
- forming a diffusion barrier layer over the metal pad region;
- forming a seed layer over the diffusion barrier layer;
- forming a copper layer over the seed layer; and
- forming a solder layer over the copper layer.

16. The method of claim 15, wherein forming the microbump structure further comprises forming a nickel layer between the copper layer and the solder layer.

17. The method of claim 12, wherein forming the second passivation layer comprises covering an entirety of the testing pad region.

18. The packaged IC chip of claim 11, further comprising:
- a bump on the metal pad; and
- wherein the additional passivation layer is not disposed between the bump and an underlying substrate.

19. The packaged IC chip of claim 1, wherein a top surface of the first passivation layer between the testing pad and the metal pad defines an uppermost surface of the packaged IC chip at a region disposed between the testing pad and the metal pad.

20. The method of claim 12, wherein the defining the test pad region and the metal pad region includes performing lithographical patterning.

* * * * *